（12) United States Patent
Le et al.

(10) Patent No.: US 6,700,815 B2
(45) Date of Patent: Mar. 2, 2004

(54) REFRESH SCHEME FOR DYNAMIC PAGE PROGRAMMING

(75) Inventors: Binh Quang Le, San Jose, CA (US); Michael Chung, San Jose, CA (US); Pau-Ling Chen, Saratoga, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 12 days.

(21) Appl. No.: 10/119,273

(22) Filed: Apr. 8, 2002

(65) Prior Publication Data

US 2003/0189843 A1 Oct. 9, 2003

(51) Int. Cl.$^7$ .............................................. G11C 16/04
(52) U.S. Cl. .............................. 365/185.03; 365/185.2; 365/185.33
(58) Field of Search ....................... 365/185.03, 185.11, 365/185.22, 185.33, 185.07, 185.2, 185.12

(56) References Cited

U.S. PATENT DOCUMENTS

| | | | |
|---|---|---|---|
| 5,163,021 A | | 11/1992 | Mehrotra et al. |
| 5,497,354 A | * | 3/1996 | Sweha et al. ........... 365/230.06 |
| 5,528,543 A | * | 6/1996 | Stiegler ...................... 365/207 |
| 5,537,358 A | * | 7/1996 | Fong .......................... 365/218 |
| 5,675,537 A | * | 10/1997 | Bill et al. ............... 365/185.22 |
| 5,748,546 A | * | 5/1998 | Bauer et al. ................. 365/210 |
| 5,754,475 A | | 5/1998 | Bill et al. |
| 5,963,477 A | * | 10/1999 | Hung ..................... 365/185.22 |
| 6,310,811 B1 | | 10/2001 | Kohno |
| 6,317,362 B1 | * | 11/2001 | Nomura et al. .......... 365/185.2 |
| 6,525,969 B1 | * | 2/2003 | Kurihara et al. ....... 365/185.25 |

OTHER PUBLICATIONS

International Search Report dated Sep. 11, 2003, for International Application Ser. No. PCT/US03/04610.

* cited by examiner

*Primary Examiner*—Gene Auduong
(74) *Attorney, Agent, or Firm*—Amin & Turocy, LLP

(57) ABSTRACT

A flash memory array having multiple dual bit memory cells divided into section attached to a wordline and a pair of reference cells logically associated with each section. A method of reprogramming a section or sections of words that are required to be changed includes inputting allowed changes to the flash memory array, reading word or words to be changed in each section, programming bits in word or words to be changed in each section, refreshing previously programmed bits in the word or words that are changed, refreshing previously programmed bits in the word or words changed in each section, refreshing previously programmed bits in the remaining word or words in each section and refreshing previously programmed in each pair of reference cells in the section in which changes have been made.

9 Claims, 3 Drawing Sheets

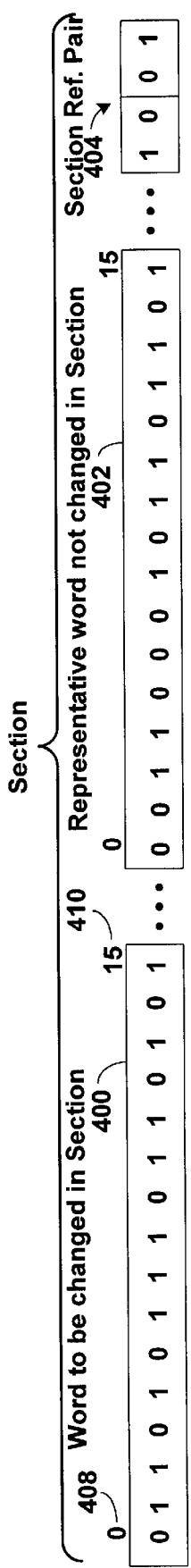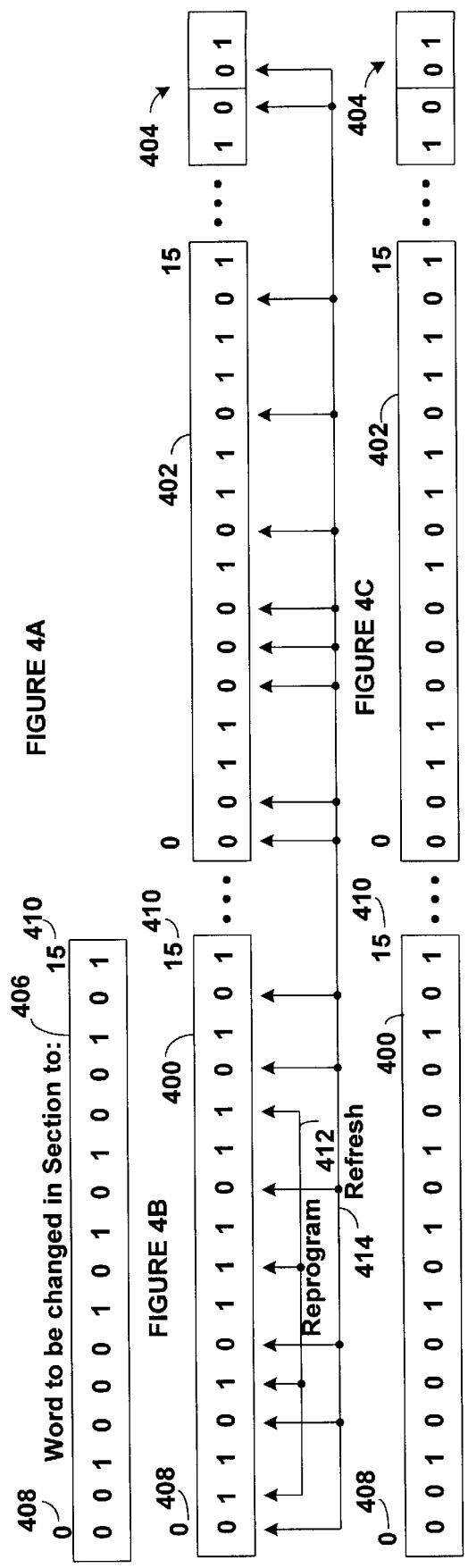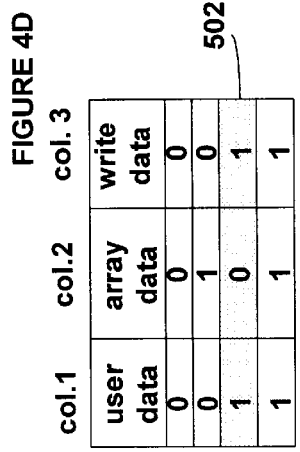

REFRESH SCHEME FOR DYNAMIC PAGE PROGRAMMING

TECHNICAL FIELD

This invention relates generally to memory systems and in particular to a memory system architecture having reference cells and a method to ensure that data cells and reference cells are the same age.

BACKGROUND ART

Flash memory is a type of electronic memory media that can be rewritten and that can hold its content without the consumption of power. Flash memory devices generally have life spans from 100K to 300K write cycles. Unlike dynamic random access memory (DRAM) devices and static random memory (SRAM) devices in which a single byte can be erased, flash memory devices are typically erased and written in fixed multi-bit blocks or sectors. Flash memory technology evolved from electrically erasable read only memory (EEPROM) chip technology, which can be erased in situ. Flash memory devices are less expensive and denser, meaning that flash memory devices can hold more data per unit area. This new category of EEPROMs has emerged as an important non-volatile memory that combines the advantages of erasable programmable read only memory (EPROM) density with EEPROM electrical erasability.

Conventional flash memory devices are constructed in a cell structure wherein a single bit of information is stored in each cell. In such single bit memory architectures, each cell typically includes a metal oxide semiconductor (MOS) transistor structure having a source, a drain, and a channel in a substrate or P-well, as well as having a stacked gate structure overlying the channel. The stacked gate may further include a thin gate dielectric layer (sometimes referred to as a layer of tunnel oxide) formed on the surface of the substrate or P-well. The stacked gate also includes a polysilicon floating gate overlying the tunnel oxide and an interpoly dielectric layer overlying the floating gate. The interpoly dielectric is often a multilayer insulator such as an oxide-nitride-oxide (ONO) layer having two oxide layers sandwiching a nitride layer. Lastly, a polysilicon control gate overlies the interpoly dielectric layer.

The control gate is connected to a wordline associated with a row of such cells to form sectors of such cell in a typical NOR configuration. In addition, the drain regions of the cells are connected together by a conductive bitline. The channel of the cell formed between the source and drain regions conducts current between the source and drain in accordance with an electric field formed in the channel by a voltage applied to the stacked gate structure by a wordline attached to the stacked gate structure. In the NOR configuration, each drain terminal of the transistors within a column is connected to the same bitline. In addition, the stacked gate structure of each flash cell in a row is connected to the same wordline. Typically, the source terminal of each cell is connected to a common source terminal. In operation, individual flash cells are addressed via the respective bitline and wordline using peripheral decoder and control circuitry for programming (writing), reading and erasing the cell.

The single bit stacked gate flash memory cell is programmed by applying a programming voltage to the control gate, connecting the source to ground and connecting the drain to a programming voltage. The resulting high electric field across the tunnel oxide results in a phenomenon called "Fowler-Nordheim" tunneling. During Fowler-Nordheim tunneling, electrons in the channel region tunnel through the gate oxide into the floating gate and become trapped in the floating gate since the floating gate is surrounded by interpoly dielectric and the tunnel oxide. As a result of the trapped electrons, the threshold voltage of the cell increases. This change in the threshold voltage (and thereby the channel conductance) of the cell created by the trapped electrons causes the cell to be programmed.

In order to erase a typical single bit stacked gate flash memory cell, a voltage is applied to the source, the control gate is held at a negative potential, and the drain is allowed to float. Under these conditions, an electric field is developed across the tunnel oxide between the floating gate and the source. The electrons that are trapped in the floating gate flow toward and cluster at the portion of the floating gate overlying the source region. The electrons are then extracted from the floating gate and into the source region by way of Fowler-Nordheim tunneling through the tunnel oxide. The cell is erased as the electrons are removed from the floating gate.

In conventional single bit flash memory devices, erase verification is performed to determine whether each cell in a block or set of cells has been properly erased. Current single bit erase verification methodologies provide for verification of bit or cell erasure, and application of supplemental erase pulses to individual cells that fail the initial verification. Thereafter, the erased status of the cell is again verified and the process continues until the cell or bit is successfully erased or the cell is marked as unusable.

Recently, dual bit flash memory cells have been introduced that allow the storage of two bits of information in a single memory cell. The conventional programming and erase verification methods employed with single bit stacked gate architectures are not adequate for such dual bit devices. The dual bit flash memory structures do not utilize a floating gate, such as the ONO flash memory device that employs a polysilicon layer over the ONO layer for providing wordline connections. Techniques that have been developed with conventional single bit flash memory devices do not work for the new dual bit flash memory cells.

The dual bit flash memory cell uses what is known as a virtual ground architecture in which the source of one bit can serve as the drain of adjacent bits. During read operations the junction nearest the cell being read is the ground terminal and the other side of the cell is the drain terminal. This is called reverse read. The drain is switched during programming and erase back to the nearest junction using Vdrain voltage instead of ground, which is used for read and verify operations.

Another problem that has emerged is the charge loss after cycling of the cell. The inventors have determined that the major challenge for dual bit operation comes from the combination of the charge loss and complimentary bit disturb under the two conditions: 1. CBD (complimentary bit disturb) at BOL (beginning of life); and 2. Charge loss post cycling at EOL (end of life or post bake). Test data indicates that the CBD is higher near the BOL and the distributions overlay the program Vt after cycling and bake (EOL). The overlap of the two distributions prevents normal read sensing schemes from working correctly for double operations. In other words, it cannot be determined where the data in a CB or NB is a one or a zero because as the distributions approach each other, it cannot be reliably determined if the data is a one or a zero. This is because the data read from the cell is compared to static references. Another problem is that the charge loss (post cycling) for a programmed cell and a CBD are not in a 1 to 1 relationship. The post cycled CBD cell loses only about 60% of the total Vt that its program cell loses. Therefore, after cycling and bake normal sensing method to read CBD and zeros cannot be used.

As a result of the poor CBD to zero window after cycling and bake, alternative methods of read were developed and explored. Of the many alternative methods of read, a method was developed called the "Average Dynamic Reference Method" and was determined to be the best method and solved many of the problems associated with dual bit operation. The average dynamic reference method extended the usable life of the dual bit memory cell to the designed life. The average dynamic reference method uses two reference cells "averaged" and the averaged current is compared to the current of the cell being read. The reference cells are cycled with the array. This means that the reference cells are the same "age" because they have endured the same number of cycles as the data cells to which they are being compared. In order to ensure that the reference cells are the same age as the data cells, a method was developed to recycle the reference cells when the sector array cells are recycled.

Therefore, what is needed is an architecture and a method of keeping the reference cells in "sync" (the same age) with the data cells.

SUMMARY OF THE INVENTION

According to the present invention, the foregoing and other objects and advantages are obtained by a flash memory array and a method of reprogramming and refreshing bits in words that are to be changed.

In accordance with an aspect of the invention, multiple dual bit flash memory cells are divided into sections and attached to a common wordline with a pair of references cells logically associated with each section.

In accordance with another aspect of the invention, allowed changes are input to the memory array which reads the word or words to be changed. Bits that are to be programmed are programmed in each section to be changed and bits that are not to be changed in the word or words are reprogrammed.

In another aspect of the invention, previously programmed bits in the remaining word or words in the section are programmed.

In another aspect of the invention, previously programmed bits in the reference cells are programmed.

The described flash memory array and method of reprogramming bits to be changed and refreshing previously programmed bits provides a flash memory array and method that ensures that reference cells and data cells are the same age.

The present invention is better understood upon consideration of the detailed description below, in conjunction with the accompanying drawings. As will become readily apparent to those skilled in the art from the following description, there is shown and described an embodiment of this invention simply by way of illustration of the best mode to carry out the invention. As will be realized, the invention is capable of other embodiments and its several details are capable of modifications in various obvious aspects, all without departing from the scope of the invention. Accordingly, the drawings and detailed description will be regarded as illustrative in nature and not as restrictive.

BRIEF DESCRIPTION OF DRAWINGS

The novel features believed characteristic of the invention are set forth in the appended claims. The invention itself, however, as well as a preferred mode of use, and further objects and advantages thereof, will best be understood by reference to the following detailed description of an illustrative embodiment when read in conjunction with the accompanying drawings, wherein:

FIGS. 4A–4D illustrate the method of the present invention where one word of an 8 word section is changed and shows a representative word that is refreshed along with the reference pair associated with the 8 word section that includes the word that is changed; and FIG. 5 is a table indicating the valid changes that can be made with the present invention.

MODE(S) FOR CARRYING OUT THE INVENTION

Reference is now made in detail to a specific embodiment or specific embodiments of the present invention that illustrate the best mode or modes presently contemplated by the inventors for practicing the invention.

Figure 1:
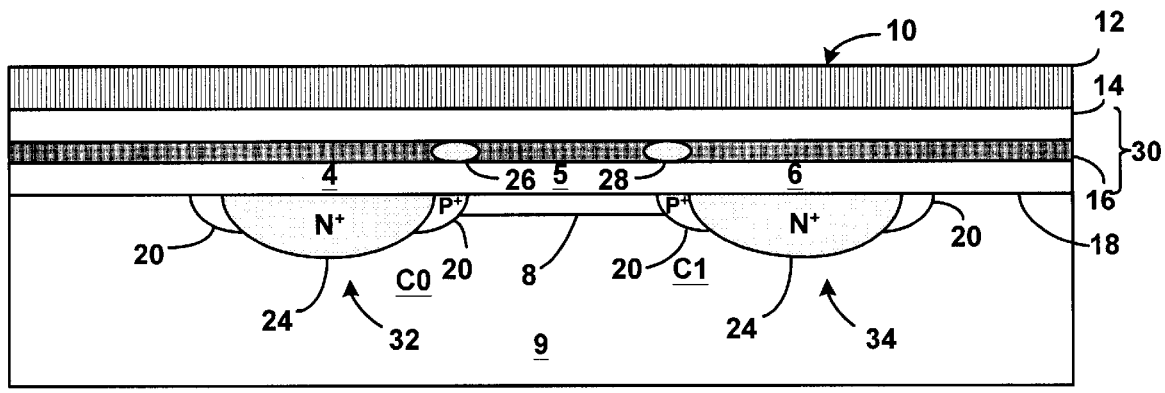
FIG. 1 is a side cross-sectional view of an exemplary dual bit memory cell in which various aspects of the present invention may be implemented.

Referring now to the drawings, FIG. 1 illustrates an exemplary dual bit memory cell 10 in which one or more of the various aspects of the invention may be carried out. The memory cell 10 comprises a silicon nitride layer 16 sandwiched between a top silicon dioxide layer 14 and a bottom silicon dioxide layer 18 forming an ONO layer 30. A polysilicon layer 12 resides over the ONO layer 30 and provides a wordline connection to the memory cell 10. A first bitline 32 runs underneath the ONO layer 30 under a first region 4 and a second bitline 34 runs underneath the ONO layer 30 under a second region 6. The bitlines 32 and 34 are formed of a conductive portion 24 and an optional oxide portion 22. Boron core implants 20 are provided on both ends of each bitline 32 and 34 where the bitlines meet the bottom silicon dioxide layer 18 or along the entire transistor. The boron core implants are more heavily doped than the P-type substrate 9 and assist in control of the VT of the memory cell 10. The cell 10 resides on a P-type substrate 9 with the conductive portion 24 of the bitlines 32 and 34 formed from an N$^+$ arsenic implant, such that a channel 8 is formed across the P-type substrate 9. The memory cell 10 is a single transistor having interchangeable source and drain components formed from the N$^+$ arsenic implant portions 24 residing on the P-type substrate region 9 with a gate formed as part of a polysilicon wordline 12.

The silicon nitride layer 16 forms a charge trapping layer. Programming a cell is accomplished by applying appropriate voltages to the bitline acting as the drain terminal, to the gate and grounding the source bitline acting as the source terminal. The voltages generate electrical fields along the channel causing electrons to accelerate and jump from the substrate layer 9 into the layer 16 of nitride, which is known as hot electron injection. Since the electrons gain the most energy at the drain, these electrons become trapped and remain stored in the layer 16 of nitride near the drain. The cell 10 is generally uniform and the drain and source are interchangeable. Since the layer 16 silicon nitride is non-conducting, a first charge 26 can be injected into the nitride 16 near a first end of the central region 5 and a second charge 28 can be injected into the layer 16 of silicon nitride near a second end of the central region 5. Therefore, if the charge does not move there can be two bits per cell instead of one bit per cell.

As previously stated, the first charge 26 can be stored in the layer 16 of silicon nitride at a first end of the central region 5 and the second charge 28 can be stored at the other end of the central region 5 such that two bits can reside per memory cell 10. The dual bit memory cell 10 is symmetrical allowing the drain and the source to be interchangeable. Thus, the first bitline 32 may serve as the drain terminal and the second bitline 34 as the source terminal when programming the left bit C0. Likewise, the second bitline 34 may serve as the drain terminal and the first bitline 32 as the source terminal for programming the right bit C1.

Figure 2A:
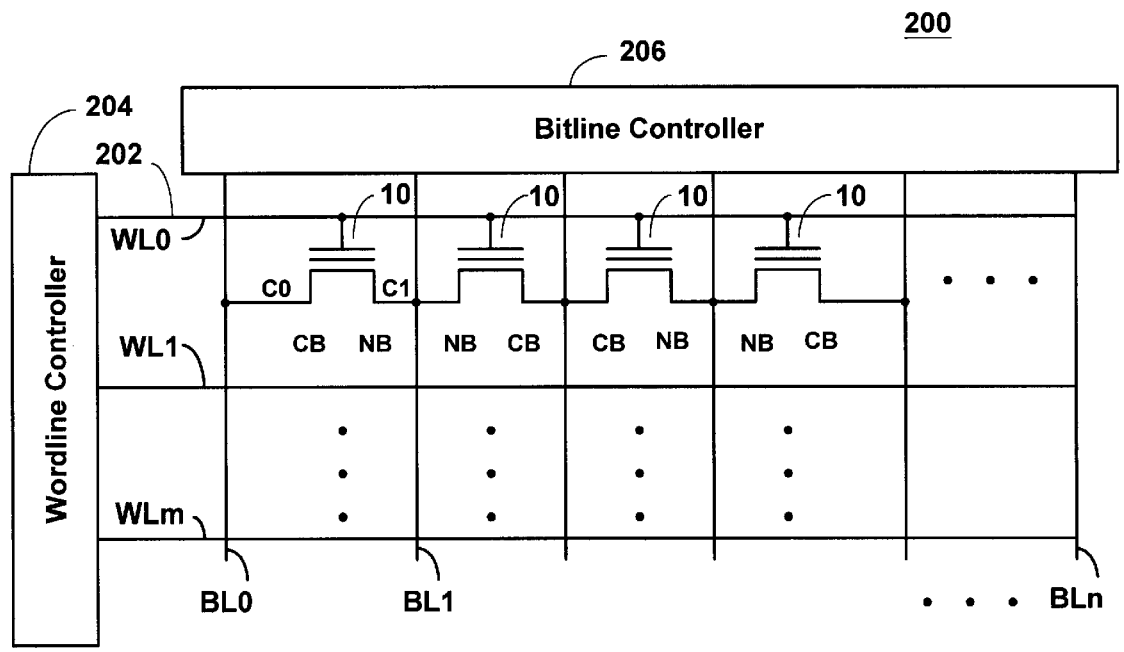
FIG. 2A is schematic showing the interconnections of a portion of an array.

FIG. 2A and Table 1 illustrates one particular set of voltage parameters for performing reading, programming, single and double sided erases of the dual bit memory cell 10 having the first bit C0 and the second bit C1.

TABLE 1

| Operation | Cell | Gate | Bitline 0 | Bitline 1 | Comment |
|---|---|---|---|---|---|
| read | C0 | 4.7 v | 0 v | 1.2 v–2 v | Complimentary bit |
| read | C1 | 4.7 v | 1.2 v–2 v | 0 v | normal bit |
| program | C0 | Vpp | 5.6 v | 0 v | hot electron |
| program | C1 | Vpp | 0 v | 5.6 v | hot electron |
| Two-side erase | All cells | –6 v | 6 v | 6 v | Hot hole injection |
| One side-erase | C0, read col | –6 v | 6 v | 0 v | Hot hole injection |

Referring to FIG. 2A there is shown a portion 200 of a memory array made up of dual bit memory cells 10 such as the dual bit memory cell 10 shown in FIG. 1. The portion 200 of the memory array shows dual bit memory cells 10 connected to a common wordline 202. The common wordline is connected to a wordline controller 204 that provides appropriate voltages to the various wordlines for reading, programming and erasing the cells in the memory array. Bitlines BL0 through BLn connect the cells 10 to a bitline controller 206 that provides appropriate voltages to the various cells for reading, programming and erasing the various cells. As noted above, the number of dual bit memory cells connected to a wordline can be very large and can be 128 words or more. For example, if each word is a 16 bit word, there are 2048 bits connected to a wordline.

Figure 2B:
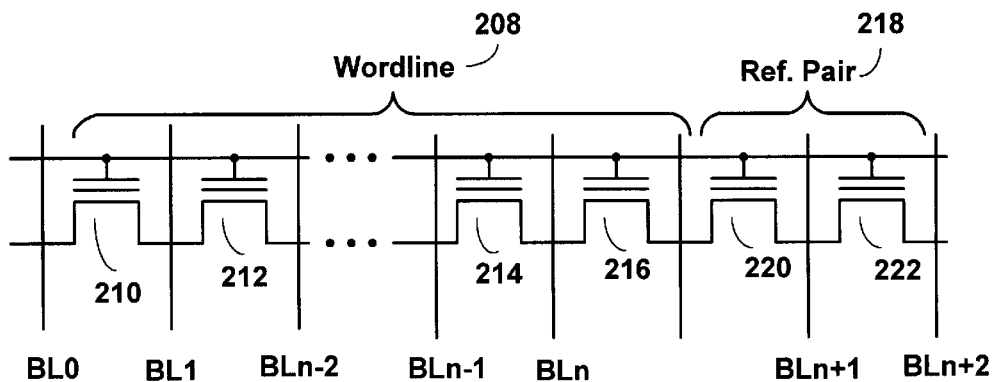
FIG. 2B is a schematic showing a wordline having a reference pair of memory cells associated with the wordline.

FIG. 2B is a schematic showing a wordline 208 having dual bit memory cells 210 through 216 that function as data cells (cells that contain data information) and a reference pair 218 of dual bit memory cells 220 and 222 that function as reference cells. Flash memory cells are disposed in an array having a common wordline that extends over a number of pages with each page having 8 or 16 or some other number of data words/page. If there are 128 data words per wordline with 16 bits/word there are then 2048 bits per wordline. In FIG. 2B each wordline has a pair of reference cells logically associated with the wordline. It is noted that the reference cells are shown physically connected at the end of the wordline, however the reference cells can be physically connected to the wordline at any point. Presently, if a customer wishes to change a word connected to the wordline, the customer must erase and reprogram all 2048 bits connected to that wordline including the bits in the reference pair to ensure that the data cells and the cells in the reference pair are the same age. As should be appreciated, customers would prefer not to have to reprogram all the cells on a wordline each time a single word has to be reprogrammed. For example, if the customer needs to change only one of the bits in cell 210, and if it is required that the data cells and reference cells remain in sync (the same age) the entire 2048 bits must be erased and reprogrammed. Since there are a finite number of erase/program cycles and since each erase/program cycle takes time, the requirement to erase the entire 2048 bits is detrimental to both the life of the memory array, it is inefficient.

Figure 2C:
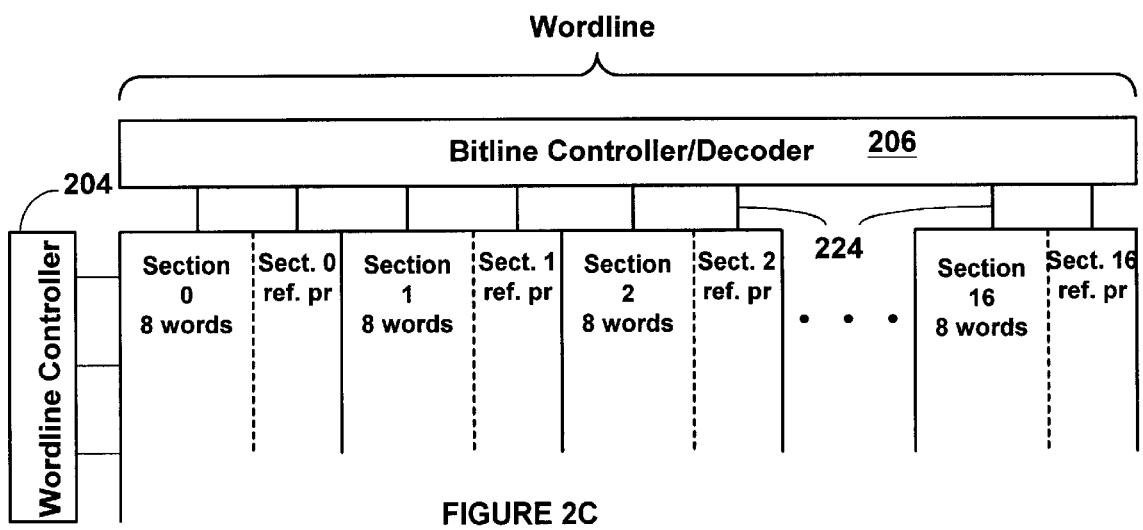
FIG. 2C is a schematic showing the cells in a wordline divided into sections with each section having a logically disposed associated reference pair.

FIG. 2C is a schematic illustrating a solution to the requirement that all 2048 bits on a wordline must be reprogrammed each time a word attached to a wordline is changed, to minimize the number cycles to which words not changed are subjected and to minimize the time associated with changing a word or words on a wordline. The solution shown in FIG. 2C is to divide the total number of words attached to a wordline into sections and in FIG. 2C it is shown that each section contains 8 words with a logically disposed reference pair associated with each section. Therefore, if each wordline has 128 words and each section has 8 words, there are 16 sections and 16 pairs of reference cells associated with the 16 sections. As should be appreciated, the number of words assigned to each section is arbitrary and other numbers of words/section could be selected. It is intended that other numbers of words per section is comprehended by this invention and the selection of 8 words per section is for illustration and discussion purposes only. The bitline controller/decoder 206 controls the voltages applied to the cells in each section via bitlines represented indicated at 224. It is noted that the single interconnections 224 shown between the bitline controller/decoder 206 and each section and each section reference pair represents numerous bitline connections.

Figure 3:
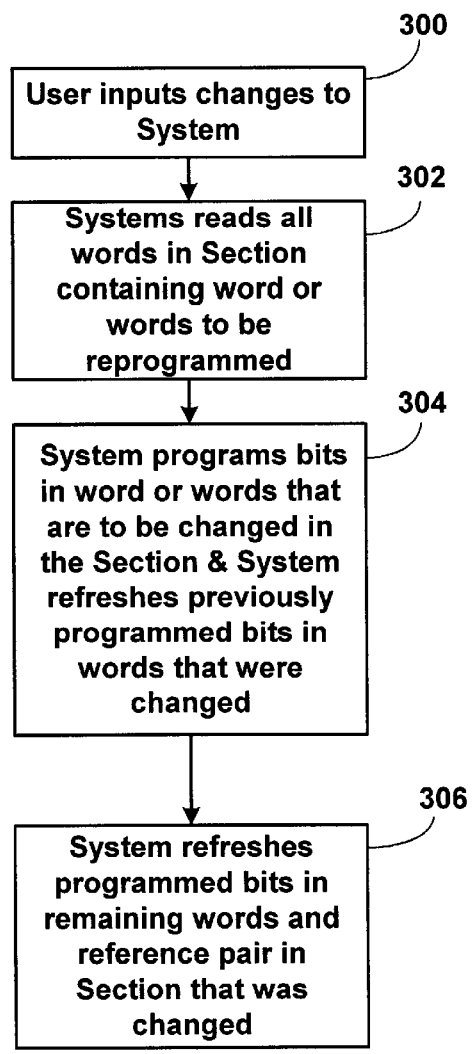
FIG. 3 is a flow diagram showing the steps to reprogram bits to be changed in a word or words in a section and to refresh remaining programmed bits in the remaining words in the section in which a word or word is/are to be reprogrammed.

FIG. 3 is a flow diagram showing the basic method associated with the architecture of the present invention. As indicated at 300, a user inputs required changes to the system. The user only inputs changes not requiring an erase, that is, there is no change requiring a 0 (a programmed bit) to be changed to a 1 (an unprogrammed or blank bit). See FIG. 5 for valid changes that can be accomplished by the present invention. The system reads all words in the Section or Sections that contain(s) the word or words to be reprogrammed at 302. At 304, the system programs bits in the word or words in accordance with the user input at 300. At 304, the system also refreshes (reprograms) previously programmed bits in the word or words that was/were changed. At 306, the system refreshes bits that have previously been programmed in the remaining words and in the associated reference pair in the Section or Sections that included the word or words that were changed.

FIGS. 4A–4D illustrate the method of the present invention where one word of an 8 word section is changed and shows a representative word from the remaining 7 words that is refreshed along with the reference pair associated with the 8 word section that includes the word that is to be changed.

FIG. 4A shows a word to be changed in a section at 400. A representative word that is not to be changed is shown at 402. An associated reference pair is shown at 404.

FIG. 4B shows at 406 to what the word at 400 is to be changed. Bits 1, 4, 7 & 11 are to be changed. The bits are numbered from left to right with bit 0 and bit 15 being indicated at 408 & 410, respectively.

FIG. 4C shows the words at 400, 402 and the reference pair as shown in FIG. 4A prior to being changed. At 412, there are shown bits 1, 4, 7 & 11 being changed by being reprogrammed. At 414, there is shown the previously programmed bits that are not being changed in the word being changed being refreshed. In addition, the bits that were previously programmed in the representative word are shown being refreshed and the previously programmed bits in the reference pair are shown being refreshed (reprogrammed).

FIG. 4D shows the words after the reprogram and refresh are completed.

FIG. 5 is a table 500 indicating the valid changes that can be made with the method of the present invention. The user data (showing what the user wishes a bit to be) is shown in column 1, the existing array data is shown in column 2 and the write data is shown in column 3. Row 502 show a non-valid function that would require an erase in which case the user would call up and execute an erase function.

In summary, the described flash memory array and method of reprogramming bits to be changed and refreshing previously programmed bits provides a flash memory array and method that ensures that reference cells and data cells are the same age.

The foregoing description of the embodiment of the invention has been presented for purposes of illustration and description. It is not intended to be exhaustive or to limit the invention to the precise form disclosed. Obvious modifications or variations are possible in light of the above teachings. The embodiment was chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A flash memory array, comprising:
multiple dual bit flash memory cells attached to a common wordline;
the multiple dual bit flash memory cells attached to the common wordline divided into sections;
a pair of reference cells logically associated with each section;
a pair of bitlines attached to each of the flash memory cells in each section and a pair of bitlines attached to the pair of reference cells;
a bitline controller/decoder attached to the pair of bitlines attached to the flash memory cells and the pair of bitlines;
a wordline controller attached to the common wordline; and
synchronizing means for maintaining a same age for the reference cells and the flash memory cells of each section.

2. A method of reprogramming and refreshing dual bit flash memory cells in a dual bit flash memory array wherein multiple dual bit flash memory cells are attached to a common wordline and divided into sections wherein a pair of reference cells are logically associated with each section of dual bit flash memory cells, the method comprising:
  (a) inputting changes to the flash memory array;
  (b) reading word or words to be changed in each section;
  (c) programming bits in word or words to be changed in each section;
  (d) refreshing previously programed bits in word or words changed in each section;
  (e) refreshing previously programmed bits in remaining word or words in each section; and
  (f) refreshing previously programmed bits in the pair of reference cells logically associated with each section of dual bit flash memory cells; such that each section of the dual bit flash memory cells and respective reference cells are synchronized for a cycle number.

3. The method of claim 2 wherein step (a) is accomplished by a user inputting allowable changes to the flash memory array.

4. The method of claim 2 wherein step (c) is accomplished by changing erased bits in the word or words to be changed to programmed bits.

5. The method of claim 2 wherein step (d) is accomplished by reprogramming previously programmed bits in the words or words changed.

6. The method of claim 2 wherein step (e) is accomplished by reprogramming previously programmed bits in the remaining word or words in each section that included a changed word.

7. The method of claim 2 is accomplished by programming previously programmed bits in the reference pairs associated with each section.

8. A method of changing a word in a memory section of a flash memory array comprising:
reading the word to be changed in the section of the flash memory array, the section comprising a data cell to be changed, a data cell remaining unchanged, and a reference cell;
reprogramming a digital "1" into the data cell to be changed;
refreshing the data cell remaining unchanged, and
refreshing the reference cell, such that data cells of the section and the reference cell maintain a same age.

9. The method of claim 8, further comprising:
issuing an address for selecting a memory cell; and
issuing data to be written to the memory cell.

* * * * *

UNITED STATES PATENT AND TRADEMARK OFFICE
CERTIFICATE OF CORRECTION

PATENT NO. : 6,700,815 B2 Page 1 of 1
DATED : March 2, 2004
INVENTOR(S) : Binh Quang Le et al.

It is certified that error appears in the above-identified patent and that said Letters Patent is hereby corrected as shown below:

<u>Column 8,</u>
Line 34, "(c)" should be -- (e) --

Signed and Sealed this

Fifteenth Day of June, 2004

JON W. DUDAS
*Acting Director of the United States Patent and Trademark Office*